(12) United States Patent
Lane et al.

(10) Patent No.: US 8,762,822 B2
(45) Date of Patent: Jun. 24, 2014

(54) TAIL-BITING CONVOLUTIONAL DECODER AND DECODING METHOD

(75) Inventors: Richard A. Lane, Cambridge (GB); Mark B. Murphy, Cambridge (GB); Cyril Valadon, Herts (GB); Francesc Boixadera, Cambridge (GB)

(73) Assignees: MStar Semiconductor, Inc. (TW); MStar Semiconductor, Inc., Grand Cayman (KY); MStar France SAS, Issy les Moulineaux (FR); MStar Software R&D (Shenzhen) Ltd., Shenzhen (CN)

( * ) Notice: Subject to any disclaimer, the term of this patent is extended or adjusted under 35 U.S.C. 154(b) by 218 days.

(21) Appl. No.: 13/351,613

(22) Filed: Jan. 17, 2012

(65) Prior Publication Data

US 2013/0124947 A1 May 16, 2013

(30) Foreign Application Priority Data

Nov. 16, 2011 (EP) .................................... 11189317

(51) Int. Cl.
*H03M 13/03* (2006.01)
(52) U.S. Cl.
USPC ........... 714/786; 714/755; 714/773; 714/795; 375/341
(58) Field of Classification Search
USPC .................................. 714/755, 773, 786, 795
See application file for complete search history.

(56) References Cited

U.S. PATENT DOCUMENTS

| 7,856,591 | B2 * | 12/2010 | Shi et al. ........................ 714/795 |
| 2002/0110203 | A1 * | 8/2002 | Sarkar ............................ 375/341 |
| 2006/0168501 | A1 * | 7/2006 | Cho et al. ....................... 714/795 |
| 2006/0242531 | A1 * | 10/2006 | Hedayat et al. ................ 714/755 |
| 2009/0238311 | A1 * | 9/2009 | Schmidl et al. ................ 375/341 |
| 2012/0079353 | A1 * | 3/2012 | Liikanen et al. .............. 714/773 |
| 2012/0151304 | A1 * | 6/2012 | Wu et al. ........................ 714/786 |
| 2013/0136215 | A1 * | 5/2013 | Du ................................. 375/341 |

OTHER PUBLICATIONS

Cox et al., "An Efficient Adaptive Circular Viterbi Algorithm for Decoding Generalized Tailbiting Convolutional Codes", IEEE Vehicular Technology Conference, Seacaucus, NJ, May 1993, pp. 57-68.
Odin et al., "An Efficient Decoding Algorithm for Tailbiting Codes on Wireless Channels", ISWCS, 2009, pp. 672-676.
Hosemann et al., "Hardware-Software Codesign of a 14.4Mbit-64 State-Viterbi Decoder for an Application-Specific Digital Signal Processor", IEEE 2003, pp. 45-50.
Mohammad et al., "Comparing List Viterbi Algorithms With and Without Tail Bits", IEEE 2008, pp. 1 of 6.
Feygin et al., "Architectural Tradeoffs for Survivor Sequence Memory Management in Viterbi Decoders", IEEE 1993, pp. 425-429.

(Continued)

*Primary Examiner* — Sam Rizk
(74) *Attorney, Agent, or Firm* — Edell, Shapiro & Finnan, LLC

(57) ABSTRACT

Techniques are provided for decoding tail-biting convolutional codes by using information within the received data stream that traditionally has not been used or been available to the convolutional decoder, e.g., cyclic redundancy check (CRC) and bit information known by both the transmitter and receiver. Further, a single parallel trace-back is used that reduces implementation complexity. In addition, the least reliable decisions made during forward processing may be reversed in order to generate additional possible codeword candidates. These techniques can be used to reduce false detection rates (FDRs) and/or detection error rates (DERs).

20 Claims, 12 Drawing Sheets

(56) References Cited

OTHER PUBLICATIONS

Seshadri et al., "List Viterbi Decoding Algorithms with Applications", IEEE Transactions on Communications, vol. 42, No. 2/3/4, Feb./Mar./Apr. 1994, pp. 313-323.

Pai et al., "Low-Complexity ML Decoding for Convolutional Tail-Biting Codes", IEEE 2008, pp. 883-885.

Min et al., "Research on an-based Decode of Tail-biting Convolutional Codes and Their Performance Analyses Using in LTE System", IEEE Computer Society 2009, pp. 303-306.

G. David Forney, Jr., "The Viterbi Algorithm", Proceedings of the IEEE, vol. 61, No. 3, Mar. 1973, pp. 268-278.

Shao et al., "Two Decoding Algorithms for Tailbiting Codes", IEEE Transactions on Communications, vol. 51, No. 10, Oct. 2003, pp. 1658-1665.

\* cited by examiner

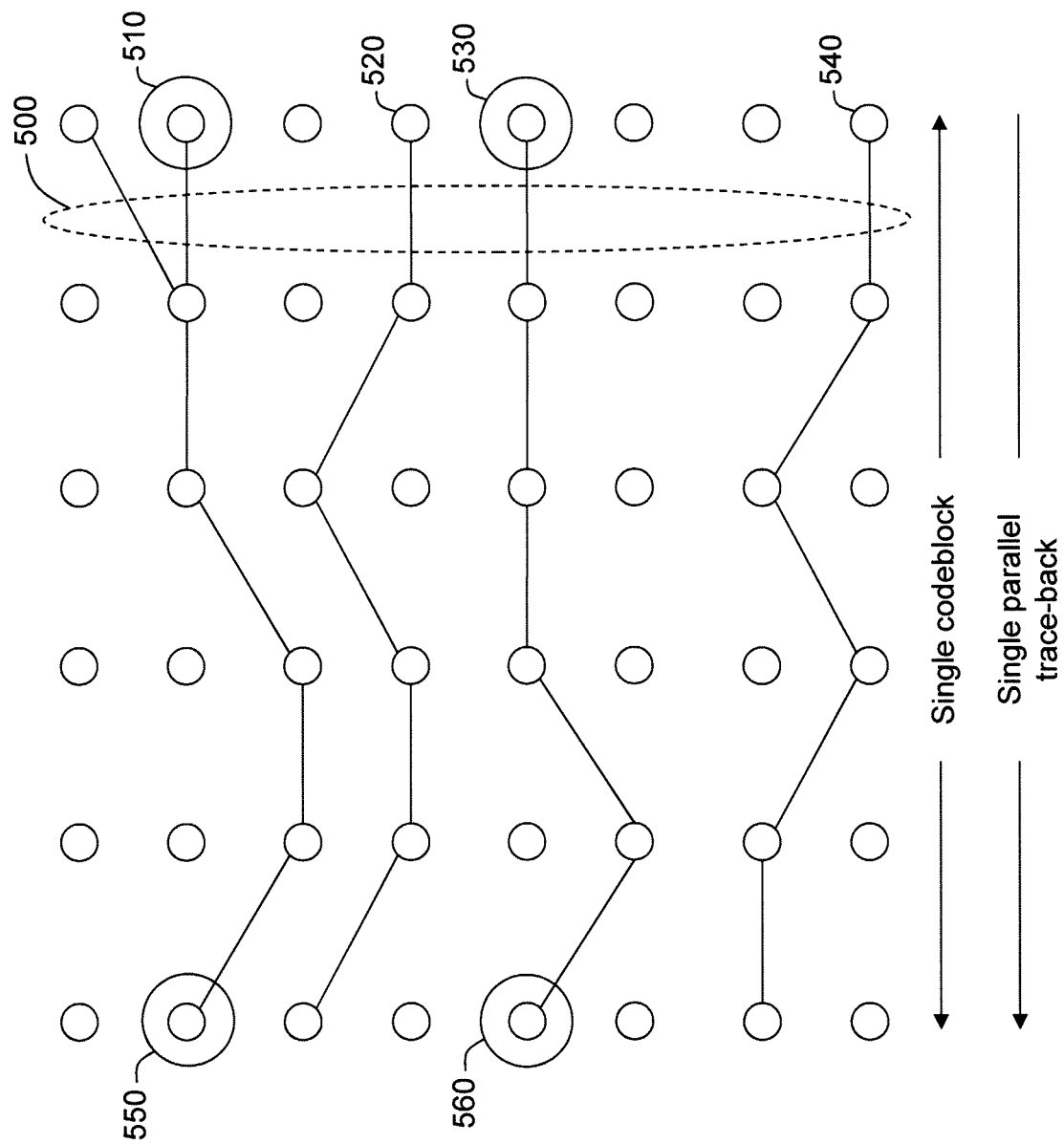

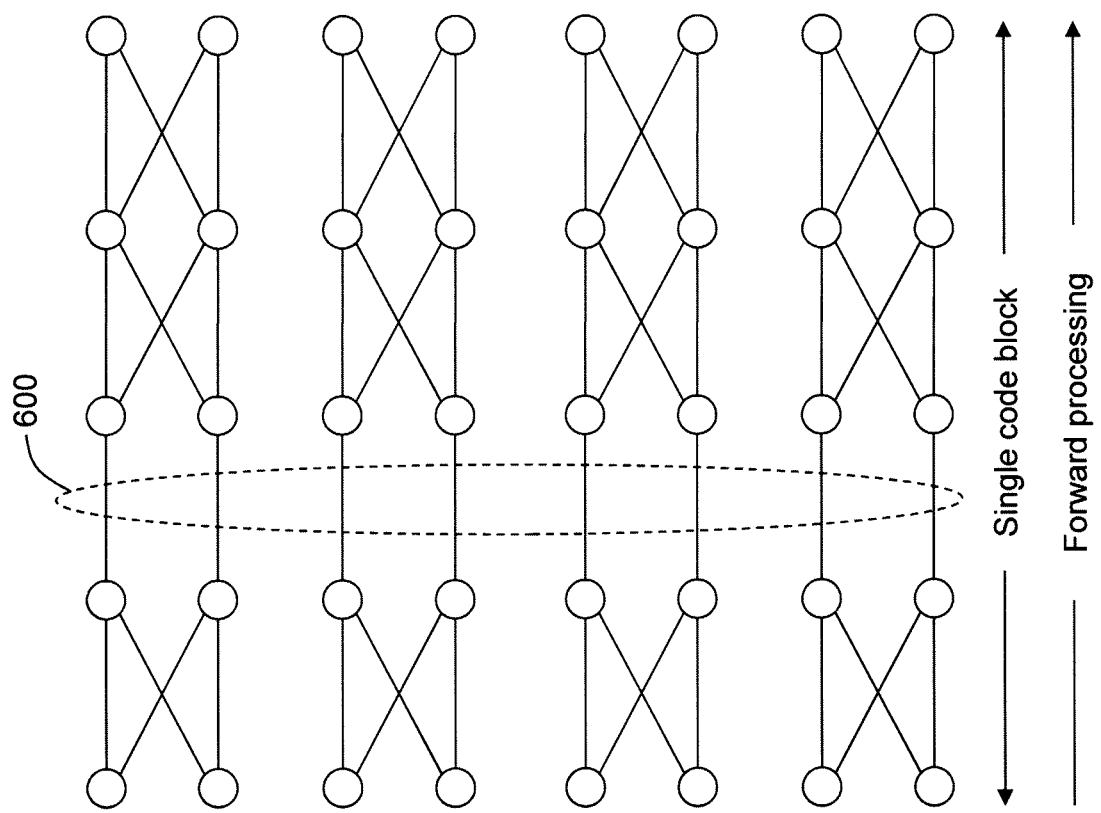

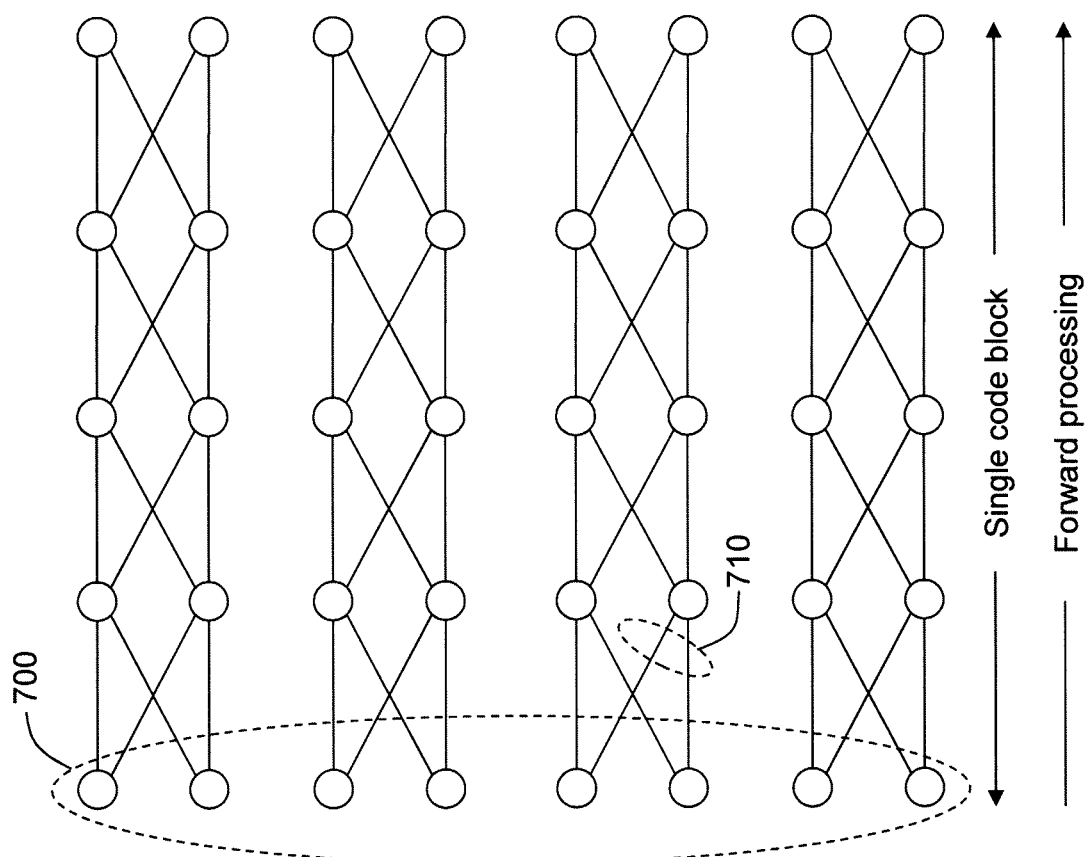

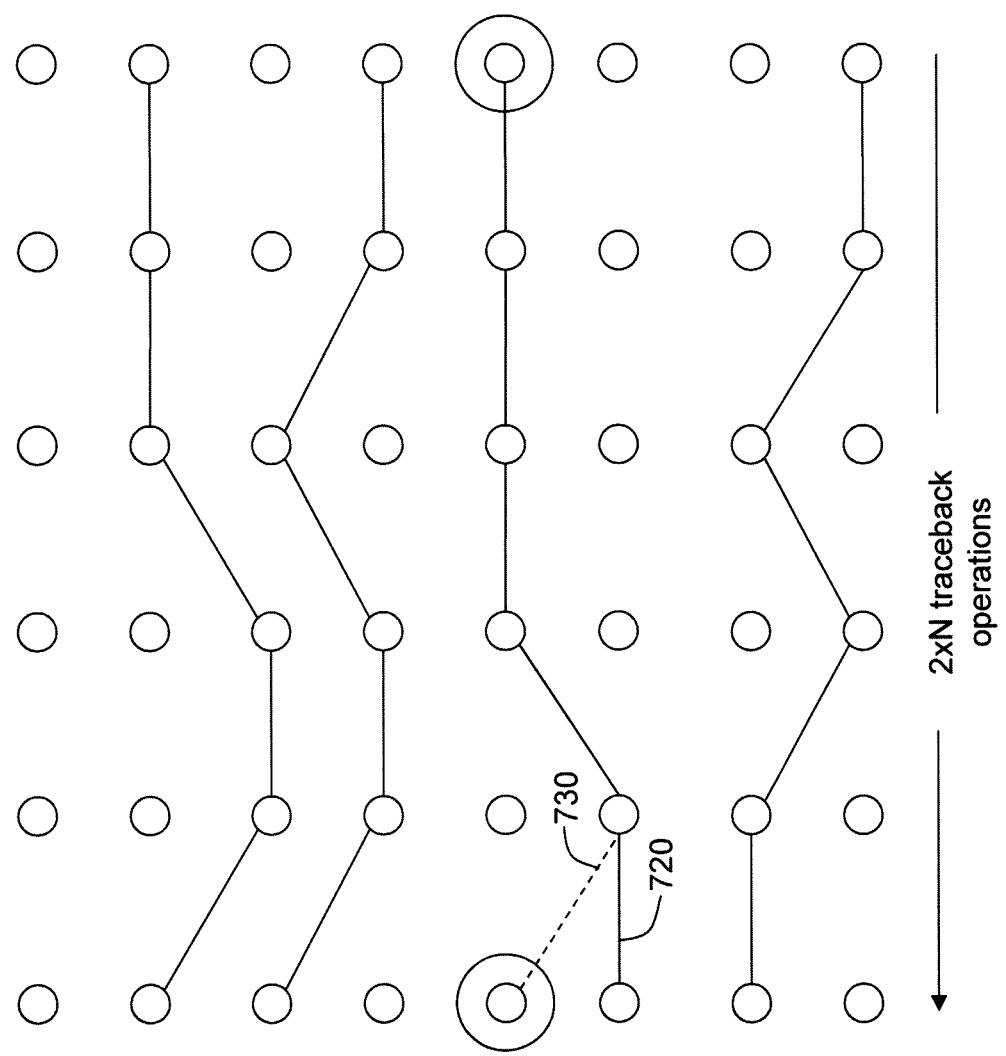

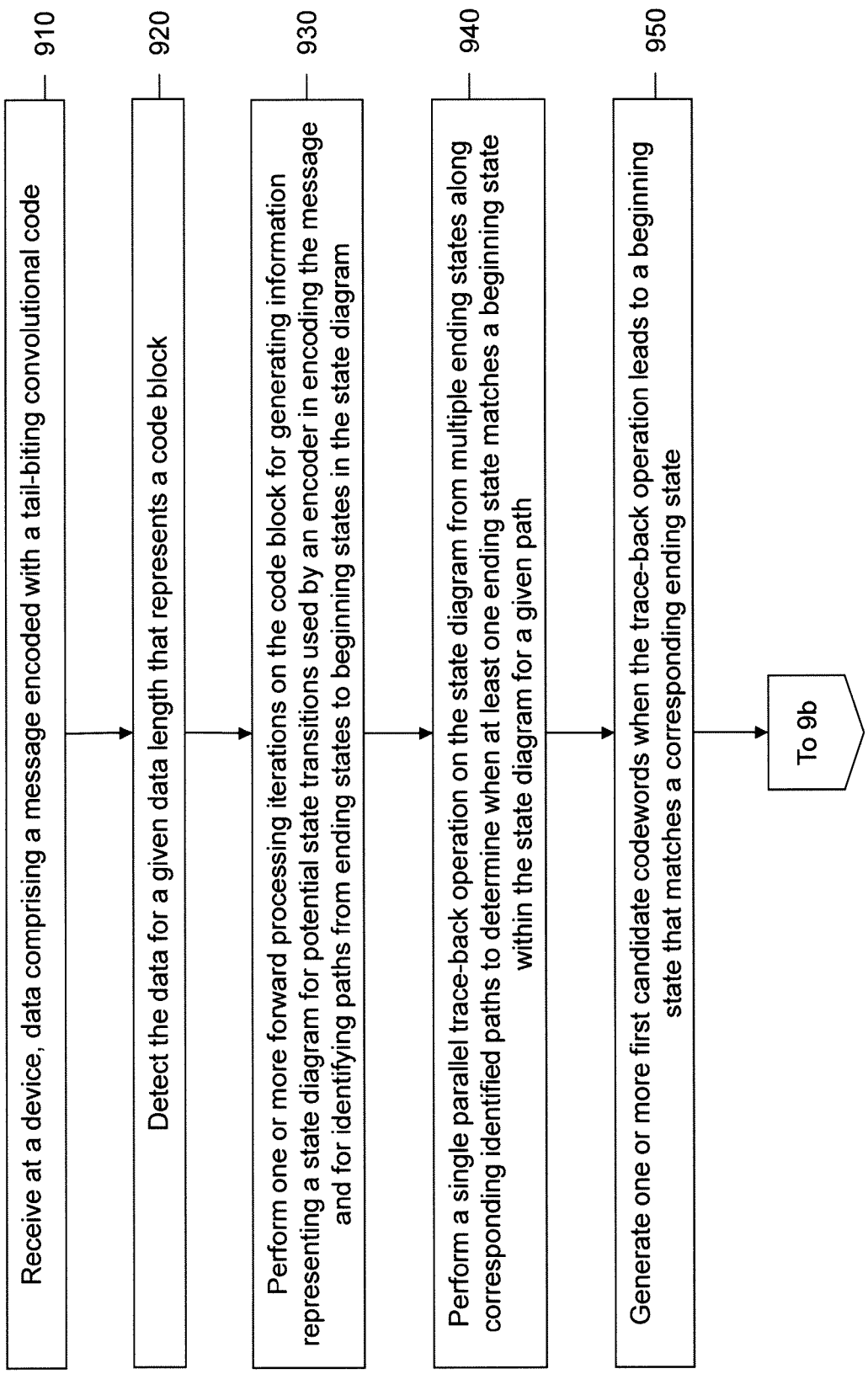

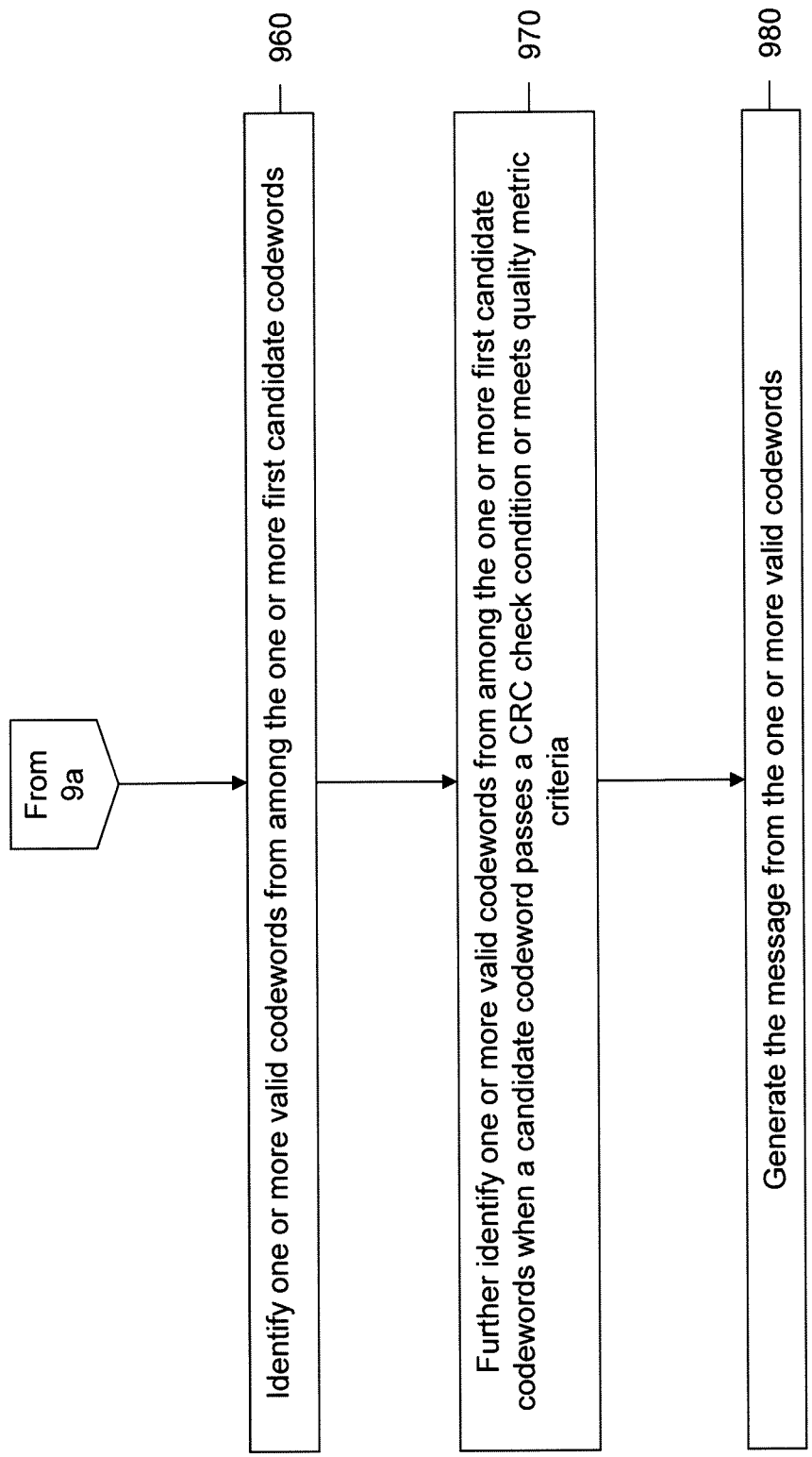

TAIL-BITING CONVOLUTIONAL DECODER AND DECODING METHOD

FIELD OF THE INVENTION

The present disclosure relates to wireless communication devices and more particularly to techniques for reducing decoding errors in wireless communication devices.

BACKGROUND OF THE INVENTION

Viterbi decoders are used at a receiver to decode a data bit stream that has been encoded with a convolutional code for forward error correction (FEC). Viterbi decoders use the Viterbi algorithm which finds the most likely sequence of hidden states, e.g., states of a hidden Markov model (Forney, G. D., Jr.; "The Viterbi algorithm," Proceedings of the IEEE, vol. 61, No. 3, pp. 268-278, March 1973). For example, when a radio frequency (RF) signal is received for decoding, the originally transmitted signal is unknown to the receiver. In addition, the originally transmitted signal may have been changed by the radio channel characteristics such as noise, fading, rain showers, etc. Accordingly, the originally transmitted signal bits are a "hidden" or unknown. FEC and Viterbi decoders are desirable when error correction is to be performed at the receiver or when feedback from the receiver to the transmitter is not practical. Viterbi decoders find practical uses in wireless communications, e.g., cellular telephone and satellite communications, speech recognition, storage verification, among others. This is the case in the $3^{rd}$ Generation Partnership Project (3GPP) Long Term Evolution (LTE) cellular communication system where a convolutional code is used to improve the decoding reliability of the control channels (3GPP Technical Specification (TS) 36.212).

When used in wireless communications the receiver has a detector that generates an output signal that is fed into a Viterbi decoder. The decoder has to decide if the transmitted bits are ones or zeros. The input to the decoder from the detector may be in a binary form, which is known as a "hard" decision, or in the form of probability value, which is known as a "soft" decision. Hard decisions are made using signal strength comparison while soft decisions may be made with a probabilistic model.

The Viterbi decoder generates a Maximum Likelihood Sequence Estimate (MLSE) of the transmitted bits by keeping track of the most likely path in the trellis associated with the convolutional code for each possible state. These most likely paths are also referred to as survivor sequences and are used to generate the decoded bit sequence. Two different approaches can be used for the generation of these sequences, register-exchange method and a trace-back method (Feygin, G.; Gulak, P.; "Architectural tradeoffs for survivor sequence memory management in Viterbi decoders," IEEE Transactions on Communications, vol. 41, no. 3, pp. 425-429, March 1993). The register-exchange method is conceptually simpler but leads to a larger number of memory accesses than the trace-back approach. The trace-back approach is therefore usually selected for implementation.

In order to help with the Viterbi decoding process, the convolutional code encoder state is often populated with 0 values. This forces the starting state in the Viterbi trellis processing to be equal to 0 and can be used to initialize the path metrics associated with the different states. Similarly, the encoder final state is often forced to 0 by appending a number of 0 bits to the end of the message. Forcing the final encoder state to 0 can lead to an improved performance as the decoder can make use of this information to decide on which survivor sequence to use for the generation of the decoded bits. The number of extra bits needed to force the final encoder state is equal to the memory or constraint length of the encoder. In other words the encoder is "flushed" with zeroes. Convolutional codes that flush the encoder with known values are known as "tailed" convolutional codes.

This performance improvement from tailed convolutional codes comes at the cost of reduced spectral efficiency since extra bits need to be added to the information message. Hence, when the information message length is large compared to the encoder memory, the spectral efficiency penalty is small and can be ignored. On the other hand, when transmitting short messages, the penalty can be significant and forcing the final encoder state to 0 (or any other fixed value) should be avoided. The spectral efficiency penalty can be avoided by using a "tail-biting" convolutional code (Ma, H.; Wolf, J.; "On Tail Biting Convolutional Codes," IEEE Transactions on Communications, vol. 34, no. 2, pp. 104-111, February 1986). Tail-biting convolutional codes do not force the initial and final states of the encoder to a known value but instead guarantee that they are both identical. This is achieved without any penalty on the spectral efficiently by initializing the state of the encoder with the final bits in the message to be transmitted.

Tail-biting convolutional codes offer performance similar to that of tailed convolutional code and do not suffer from any spectral efficiency loss. As a result of these properties, these convolutional codes are now often used for the coding and transmission of short information messages. They are, for example, used to protect some of the control channels, e.g., the physical broadcast channel (PBCH) or the physical downlink control channel (PDCCH) defined in 3GPP LTE.

It should however be noted that tail-biting convolutional codes have a higher decoding complexity. The Maximum Likelihood Detector (MLD) for a tail-biting convolutional code requires S separate Viterbi decoding operations of the whole received sequence, each hypothesized on the initial and final states of the encoder, where S represents the total number of states in the trellis associated with the convolutional code. The best path across these S different possibilities would then provide the decoded bits (Shao, R. Y.; Shu Lin; Fossorier, M. P. C.; "Two Decoding Algorithms for Tailbiting Codes," IEEE Transactions on Communications, vol. 51, no. 10, pp. 1658-1665, October 2003). A number of sub-optimum decoding algorithms have also been proposed in order to achieve near MLD performance but with a reduced complexity (Cox, R. V.; Sundberg, C. E. W.; "An Efficient Adaptive Circular Viterbi Algorithm for Decoding Generalized Tailbiting Convolutional Codes," IEEE Transactions on Vehicular Technology, vol. 3, no. 1, pp. 57-68, February 1994; and Zhang Min; Huang Junwei; Meng Jie; Deng Qiang; "Research on An-Based Decode of Tail-Biting Convolutional Codes and Their Performance Analyses Used in LTE System," 2009 International Forum on Information Technology and Applications, IFITA '09, vol. 2, pp. 303-306, 15-17 May 2009).

SUMMARY OF THE INVENTION

Techniques are provided herein for decoding tail-biting convolutional codes by using information within the received data stream that traditionally has not been used or been available to the convolutional decoder, e.g., cyclic redundancy check (CRC) and bit information known by both the transmitter and receiver. Further, a single parallel trace-back is used that reduces implementation complexity. In addition, the least reliable decisions made during forward processing may be reversed in order to generate additional possible codeword candidates. These techniques can be used to reduce false detection rates (FDRs) and/or detection error rates (DERs).

In one embodiment, data are received comprising a message encoded with a tail-biting convolutional code. The data are detected for a given data length that represents a code block. One or more forward processing iterations are performed on the code block for generating information representing a state diagram for potential state transitions used by an encoder in encoding the message and for identifying paths from ending states to beginning states in the state diagram. A single parallel trace-back operation is performed from multiple ending states along corresponding identified paths to determine when at least one ending state matches a beginning state within the state diagram for a given path. One or more first candidate codewords are generated when the trace-back operation leads to a beginning state that matches a corresponding ending state. One or more valid codewords are identified from among the one or more first candidate codewords. The message is generated from the one or more valid codewords.

The message may also be CRC encoded. The one or more valid codewords may be identified when a candidate codeword passes a CRC check condition. The CRC check condition may use one of the plurality of known CRC masks used at the encoder.

In other examples, a quality metric (QM) may be computed for each of the one or more first candidate codewords and one or more valid codewords is selected based on the quality metrics.

When performing the one or more forward processing iterations, one or more positions position in the state diagram are tracked for one or more least reliable state transition decisions. One or more second candidate codewords are generated during the trace-back operation by reversing one or more of the one or more least reliable state transition decisions in the state diagram.

A QM may also be computed for each of the one or more second candidate codewords and one or more valid codewords is selected from the one or more second candidate codewords based on the quality metrics.

The message may comprise known bit information and during forward processing, symbol state transitions in the state diagram may be forced to match the known bit information. Alternatively, the known bit information may be used to identify candidate codewords to be rejected on trace-back when states in a candidate codeword do not match states corresponding to the known bit information

BRIEF DESCRIPTION OF THE DRAWINGS

FIG. 3b depicts an expanded view of a portion of the trellis diagram from FIG. 3a.

FIG. 5 is an example trellis diagram illustrating trace-back according to the techniques described herein.

FIG. 6 is an example trellis diagram used to generate a codeword by forcing the trellis to known states according to the techniques described herein.

FIG. 7a is an example trellis diagram used to track least reliable decisions during forward processing according to the techniques described herein.

FIG. 7b is an example trellis diagram use to switch a trellis state at a least reliable decision point according to the techniques described herein.

FIGS. 9a and 9b depict an example flowchart of the Viterbi and CRC decoding process according to the techniques described herein.

DESCRIPTION OF EXAMPLE EMBODIMENTS

Figure 1:
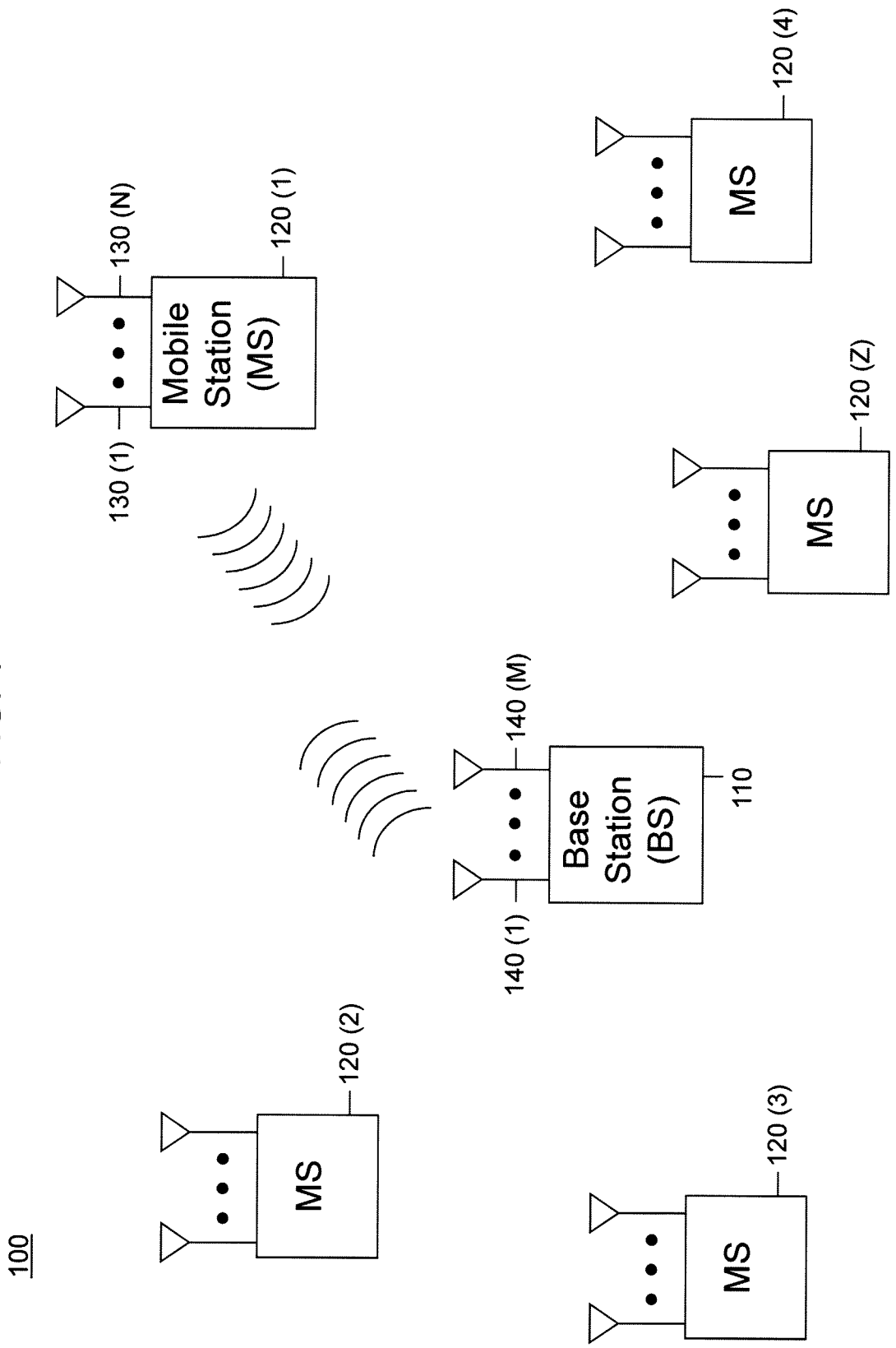
FIG. 1 is an example of a block diagram of a wireless communication system in which a base station (BS) communicates with mobile stations (MSs); each employs a Viterbi and Cyclic Redundancy Check (CRC) decoding process according to the techniques described herein.

Referring first to FIG. 1, a wireless radio communication system or network is shown generally at reference numeral 100 and comprises a base station (BS) 110, and a plurality of mobile stations (MSs) 120(1)-120(Z). The BS 110 may connect to other wired data network facilities (not shown) and in that sense serve as a gateway or access point through which the MSs 120(1)-120(Z) have access to those data network facilities.

The BS 110 comprises a plurality of antennas 140(1)-140 (M) and the MSs 120(1)-120(Z) may also comprise a plurality of antennas 130(1)-130(N). The BS 110 may wirelessly communicate with individual ones of the MSs 120(1)-120(Z) using a wideband wireless communication protocol in which the bandwidth is much larger than the coherent frequency bandwidth. Examples of such wireless communication protocols are Time Division Synchronous Code Division Multiple Access (TD-SCDMA) and Time Division Long Term Evolution (TD-LTE).

Techniques are provided herein to enable either device on a wireless communication link (e.g., a BS or an MS) to decode messages that one wireless device received from the other wireless device using a Viterbi and CRC decoder. For example, as depicted in FIG. 1, the BS 110 transmits a message to a particular MS, e.g., MS 120(1). The MS 120(1) decodes the message based on the signals it receives from the BS using the techniques described herein. The MS 120(1) may then transmit a response back to the BS 110.

Figure 2:
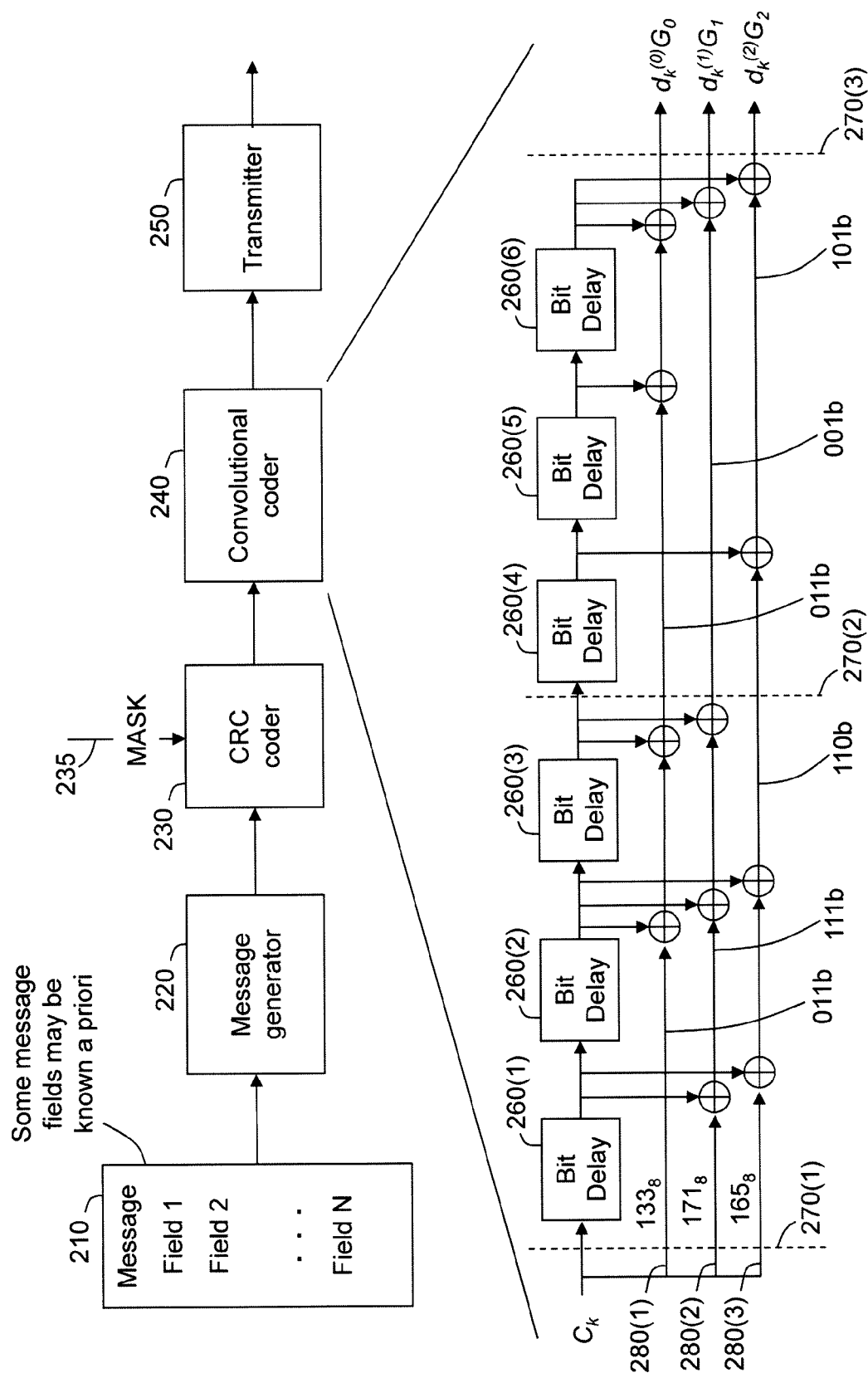
FIG. 2 is an example of a block diagram of a Viterbi and CRC encoding process according to the techniques described herein.

Referring to FIG. 2, a convolutional and CRC encoder is shown. A message 210 is fed into a message generator 220. In turn, the output of the message generator 220 is fed to the CRC coder 230 which may use a CRC mask 235. Once CRC is performed the output of the CRC coder 230 is fed to a convolutional coder 240 and subsequently transmitted by transmitter 250. It will be obvious to the person skilled in the art that it is possible to implement intermediate steps, such as rate-matching, between the output of 240 and the transmitter 250 without impacting the different techniques described herein. The message 210 may have predetermined data fields that are known to both the transmitter and the receiver, and can be used to reduce FDRs and/or DERs.

The convolutional code used by the FEC encoder is defined by two parameters: code rate and constraint length. The code rate, R=k/n, is expressed as a ratio of the number of input bits into the convolutional encoder (k) to the number of channel symbols output by the convolutional encoder (n) in a given encoder cycle. A small value for the code rate indicates a high degree of redundancy, providing higher effective error control at the expense of increasing the bandwidth of the encoded signal. For example, the input bit sequence $C_k$ is sent through three encoder pathways that each produce an output bit. Accordingly, the code rate for this encoder is ⅓.

In this example, the convolutional coder 240 has six delay segments 260(1)-260(6). A sequence of bits $C_k$ is clocked through the delay segments 260(1)-260(6). In addition to the delay segments 260(1)-260(6), the input bits $C_k$ are fed through a series of exclusive-OR (XOR) gates, denoted by the symbol ⊕. At 280(1), the input bit is XOR'd with delayed bits 260(2), 260(3), 260(5) and 260(6) which define the function $G_0$. $G_0$ can also be written in polynomial notation that described the encoding function, e.g., $G_0=1+x^2+x^3+x^5+x^6$ which corresponds to the delays 260(2), 260(3), 260(5) and 260(6), respectively, with a 1 at the beginning by convention.

For ease of illustration and notation, the convolutional coding has been broken into three stages, 270(1)-270(3). Between 270(1) and 270(2), for feed 280(1), there is no XOR for bit delay 260(1), and XORs for bit delays 260(1) and 260(2). If the absence of a bit delay can be represented by a zero while the presence of a bit delay can be represented by a one, then the delay for this stage can be represented by in binary as 011b (as viewed in FIG. 2)) or $3_8$ (octal). Between 270(1) and 270(2), for feed 280(2), there are XORs for bit delays 260(1)-260(3), which can be represented as 111b or $7_8$. For feed 280(3), there are XORs for bit delays 260(1) and 260(2), but no bit delay for 260(3) and is represented as 110b or $6_8$. The bit delays between 270(2) and 270(3) can be represented as 011b/$3_8$, 001b/$1_8$, and 101b/$5_8$, for feeds 260(1)-260(3), respectively.

Accordingly, $G_0=1+x^2+x^3+x^5+x^6$ can be represented in shorthand notation by $133_8$, with the 1 representing the first term of the equation. Similarly, $G_1=1+x^1+x^2+x^3+x^6$ can be represented in shorthand notation by $171_8$, and $G_2=1+x^2+x^3+x^5+x^6$ can be represented in shorthand notation by $165_8$. This type of convolutional coder is described in section 5.1.3.1 of the 3GPP TS 36.212.

At each clock cycle the next input bit $C_k$ is clocked into bit delay 260(1), which may be an electrical flip-flop. At the same time, the content of bit delay 260(1) is clocked into bit delay 260(2), and so on. The values of bit delays 260(1)-260(6) for any given clock cycle represent the state of the encoder. Since there are six bit delays the encoder has $2^6$ or 64 possible states, thereby forming a finite state machine. The state of the encoder and the input bit are used to generate the output bits $d_k^{(0)}$, $d_k^{(2)}$, and $d_k^{(2)}$ at each clock cycle by way of polynomials $G_0$, $G_1$ and $G_2$, respectively. At the decoder, the received bits are used to regenerate the states of the encoder that were used encode the transmitted bits. The possible states of the encoder are conceptually represented by a trellis diagram when viewed from the perspective of the decoder. Since the decoder does not "know" the state of the encoder, the decoder must hypothesize potential state transitions that could occur in the encoder that would generate the received bit sequence, as will be explained hereinafter.

Figure 3A:
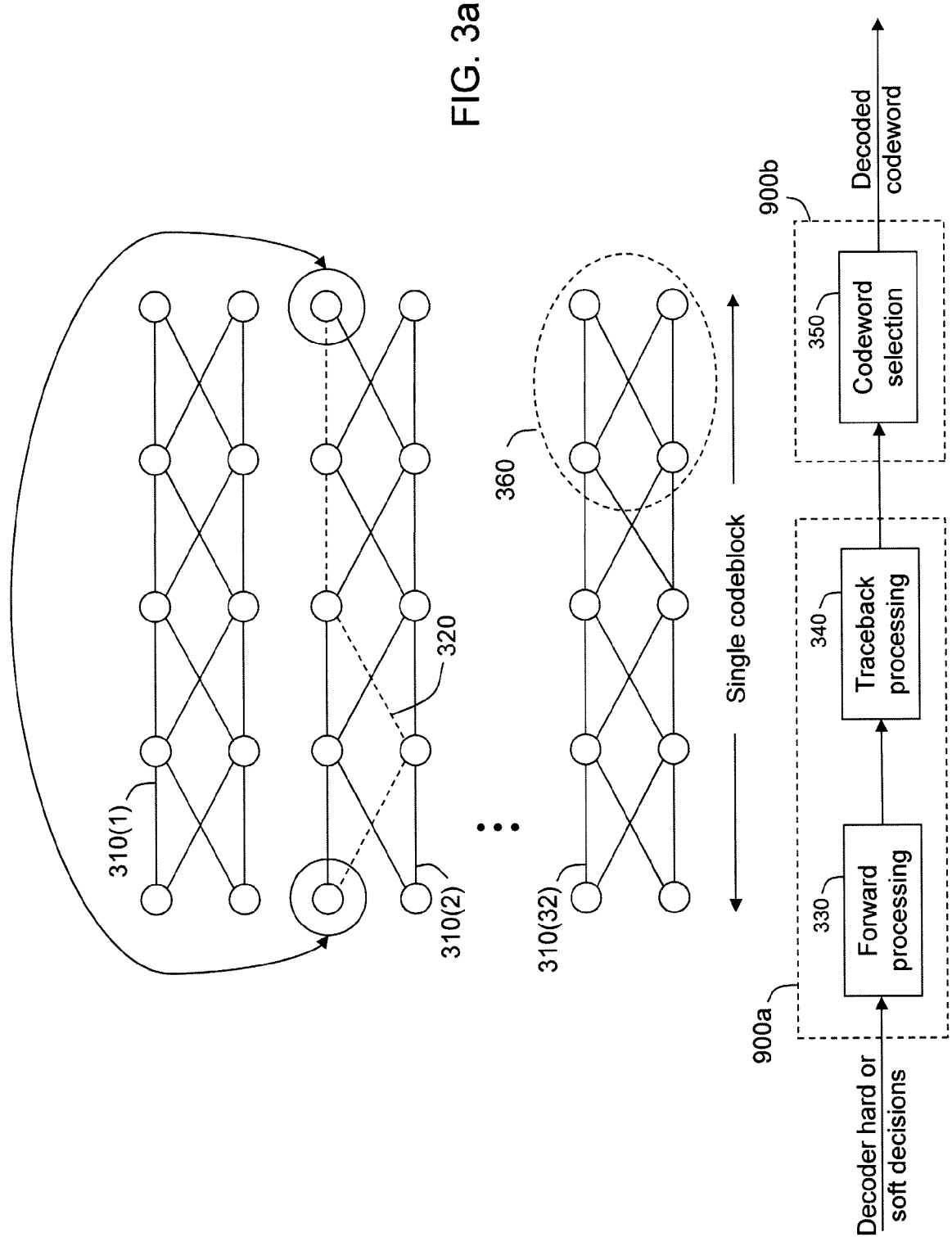
FIG. 3a is a diagram generally depicting an example trellis diagram with path and branch metrics.

Turning to FIG. 3*a*, a trellis representation of an LTE convolutional code is shown in a series of binary butterflies 310(1)-310(32). The 32 butterflies contain pairs of states, that when combined, provide 64 states (S) for the decoder. The trellis is a graphical representation of information that is stored in decoder memory. It will be appreciated by the reader that the trellis presented in FIG. 3 has been simplified in order to improve readability and is not intended to accurately depict the state connections between the butterflies at the different stages or the number of states normally traversed during decoding. One advantage of convolutional codes is their highly repetitive structure (as shown in FIG. 2), which provides for a symmetrical code tree. Due to code tree symmetry, the number of states that need to be evaluated in locating the most probable path leading to the clocked data sequence, e.g., $C_k$ is reduced. Moreover, in decoding such a symmetrical code, only the most probable (i.e., surviving) local path into each of the 64 possible encoder states is of interest and all other paths may be discarded from further consideration. This is true because the most probable path through a state must necessarily follow the surviving local path through that state.

The Viterbi decoder relies on these code properties to function as a finite state machine having a limited set of state transitions as mentioned above. The decoder hypothesizes each of the possible encoder states and determines the probability that the encoder transitioned from each of those states to the next set of possible encoder states, based on the observations obtained from the received noisy encoded data stream.

The trellis in FIG. 3*a* depicts an example code block for which a given number of states are processed. At 330, the Viterbi decoding process begins with one or more forward processing steps. Forward processing is depicted from left to right, and may begin as each set of symbol data are received for a given or predetermined number of symbols. Accordingly, the leftmost states are beginning states and the rightmost states are ending states. During forward processing a number of paths may be found through the trellis and corresponding metrics for those paths are stored, as will be described in connection with FIG. 3*b*. Briefly, the metrics may include path metrics, path histories, branch metrics, quality metrics and positions of least reliable branching decisions according to the techniques described herein.

At 340, trace-back operations begin with a single parallel trace-back according to the techniques described herein. During parallel trace-back, multiple ending states are traced backward, from right-to-left through the trellis, using the stored metrics. For convolutional codes, a parallel trace-back may lead a number of beginning states. For a tail-biting convolutional code, the beginning state must be the same state as the ending state by virtue of starting the encoder with the ending bit or bits of the information message. Trace-back paths that do not have matching beginning and ending states are discarded. The output of trace-back processing includes one or more candidate codewords and updated quality metrics.

In this example, a likely path 320 is found during trace-back processing because the starting and ending states through the trellis are identical, i.e., by design the codeword head meets the codeword tail in circular fashion. The forward processing and trace-back processing are collectively referred to herein as the Viterbi forward processing and parallel trace-back process 900*a*, as indicated at by the dashed line surrounding those operations. The process 900*a* will be generally described in connection with FIGS. 3*b*, 4, 5, 6, 7*a*, 7*b*, 8, and is described in more detail in connection with FIG. 9*a*.

At 350, a codeword selection process begins, and is referred to hereinafter as the codeword selection process 900*b*, as indicated at by the dashed line. By virtue of the parallel trace-back operation, a larger number of candidate codewords are obtained than would otherwise be obtained during conventional trace-back. The larger number of candidate codewords improves the Missed Detection Rate (MDR) but also increases the False Detection Rate (FDR), whereby an invalid codeword is decoded. To mitigate the potential increase in FDR, the codeword selection process 900*b* employs a number of techniques to reduce the number candidate codewords in the set. The process 900*b* will be generally described in connection with FIGS. 3*b* and 8, and is described in more detail in connection with FIG. 9*b*.

Figure 3B:
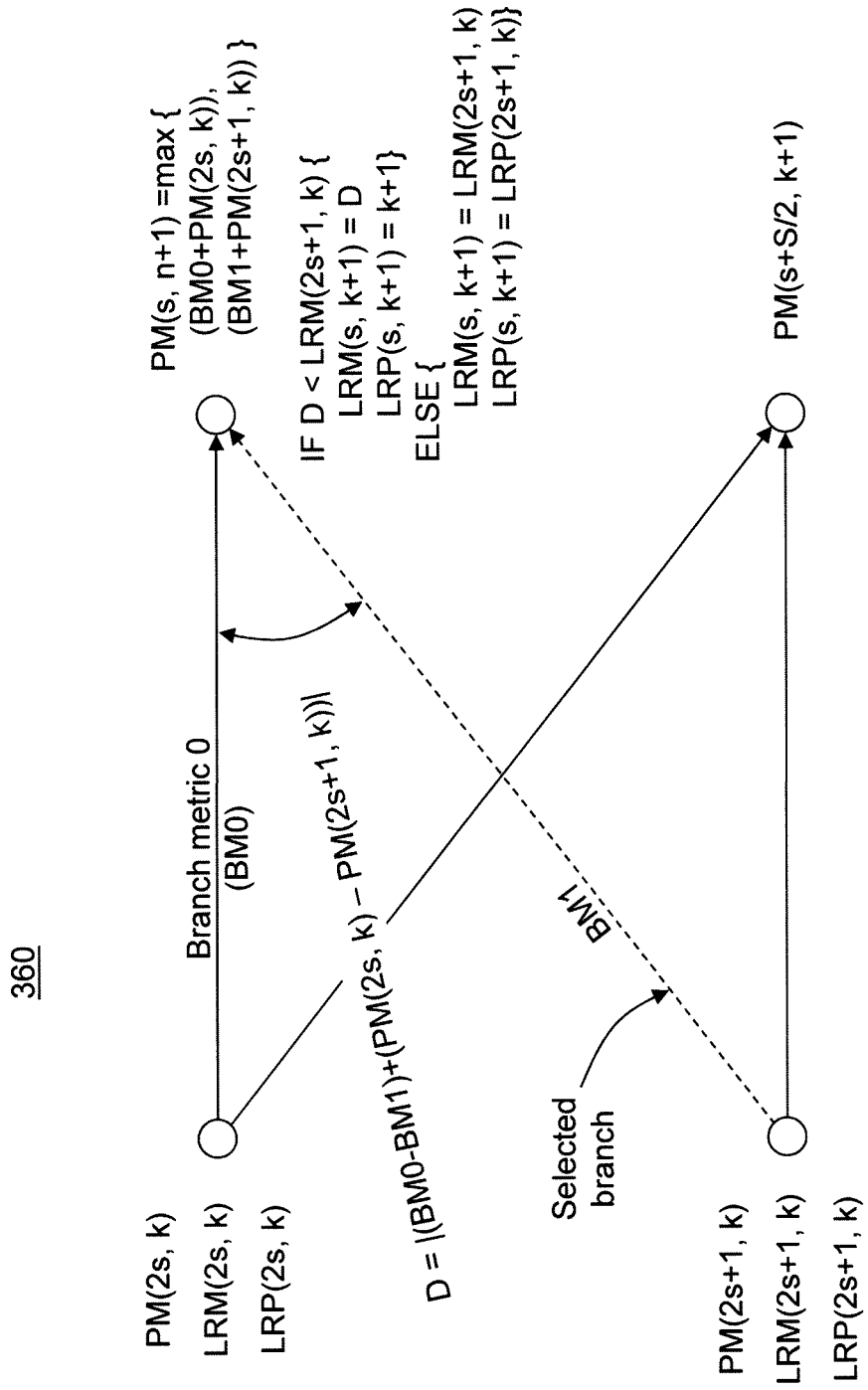

Turning now to FIG. 3b, the single butterfly 360 from FIG. 3a is shown in greater detail. The butterfly 360 depicts branch metric (BM) and path metric selection using standard butterfly notation. The transition probabilities from one state to another are represented by quantities, referred to as metrics, which may be proportional to the LLR, e.g., with respect to soft decisions. The higher the metric is, the higher the probability of occurrence. There are two types of metrics: state or path metrics, and branch metrics. The path metric represents the relative probability that the transmitted set of code symbols passed through a particular state. The branch metric represents the conditional probability that the transition from a particular source state to a particular target state was transmitted (assuming that the source state was correct).

Thus, at any time k and for any state $S_s$, the Viterbi algorithm calculates the metrics of the two paths leading to state $S_s$, determines the survivor path, and stores the survivor path as well as the associated metrics using the Viterbi forward processing and parallel trace-back process 900a. This is equivalent to storing, for every target state considered, the source state which leads to it. The information needed to generate the different survivor paths during the trace-back processing will typically be stored in Path History (PH) memories where a single bit per state is used to indicate which of the two possible leading states has been selected. The Viterbi forward processing and parallel trace-back process 900a may use an Add-Compare-Select (ACS) unit, to perform these operations. The ACS unit is responsible for calculating the state metric values and to characterize the relationships between the source and target states by virtue of the branch metrics.

In addition to branch metrics and path metrics, the butterfly introduces two new parameters, the least reliable metric (LRM) and the least reliable position (LRP), each of which are updated for each state transition at each time instant k, in a manner similar to path metrics. During the forward processing, the LRP for each path is updated for each transition with the position of the least reliable decision. The LRM is used as a confidence value associated with this least reliable decision is also updated during the forward processing. The set of confidence values associated with each state are first initialized to a very large value which is guaranteed to be larger than the absolute value of the maximum difference D in path metrics corresponding to a single merging state (such a value can be derived a priori from the knowledge of the trellis associated with the convolutional code and the maximum amplitude for the input LLR values).

The least reliable decision position values are also set equal to an initial value which uniquely identifies the start of the Viterbi forward processing. After the first Viterbi forward processing transition, the set of S least reliable decision positions and confidence values are updated as follows. For each state, the absolute value of the difference in the candidate path metrics corresponding to the two leading states is computed, i.e., $D=|(BM0-BM1)+(PM(2s, k)-PM(2s+1, k))|$ as viewed in FIG. 3b. If the absolute value of the difference is larger than the least reliable decision confidence value associated with the winning leading state, then the new least reliable decision information for the state is set equal to that of the winning leading state. On the other hand, if the absolute value for the path metrics difference is lower than the confidence value of the winning leading stage, the new least reliable decision confidence value is set equal to this absolute path metrics difference value D and the new least reliable decision position is set equal to an index corresponding to the position of the transition being processed, as shown in the pseudo code associated with the upper right state in FIG. 3b. These processing stages are repeated until the end of the Viterbi forward processing phase.

Figure 4:
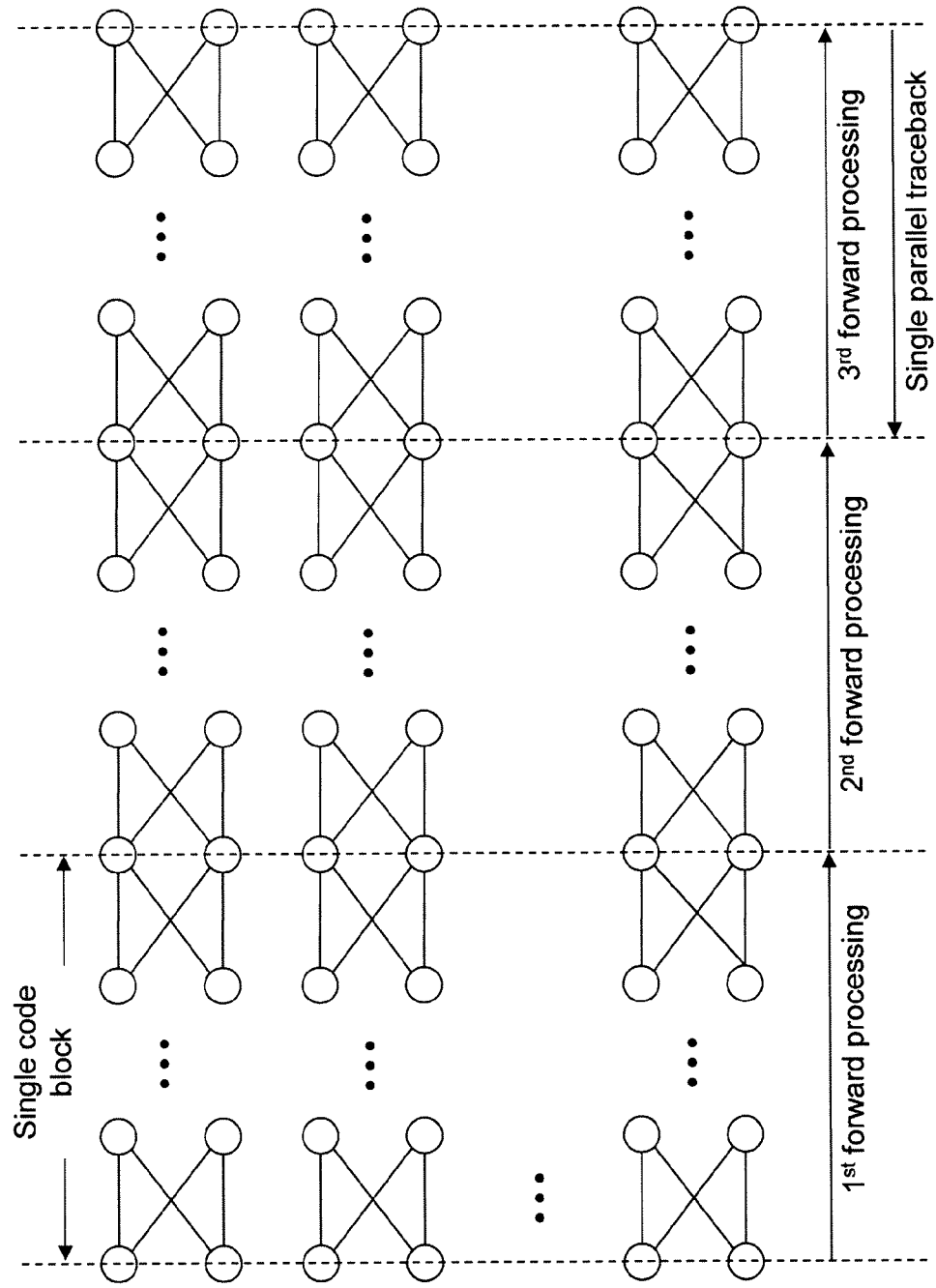
FIG. 4 is an example trellis diagram used to generate a codeword according to the techniques described herein.

Referring to FIG. 4, a trellis diagram is depicted for forward and reverse (trace-back or chainback) processing according to the techniques described herein. In this example, the same code block has been repeated three times to illustrate that forward processing is performed three times in the same code block. With each iteration, during the forward processing steps the received symbols and the metrics associated with the different states in the trellis are updated. Once all the forward iterations have been performed for forward processing, a single parallel trace-back is performed. A single parallel trace-back reduces implementation complexity and also improves MDR performance by generating more candidate codewords. Parallel trace-back is illustrated in FIG. 5.

Turning to FIG. 5, a single parallel trace-back is performed over the entire code block from right to left by convention. At 500, the trace-back is started from multiple ending states. The trace-back continues until one or more beginning states are reached. At 510-540, candidate paths were found for potential codewords. However, only two of the paths 510, and 530 had matching states 550 and 560, respectively at the beginning of the code block. At this point, the codeword selection process 900b needs to decide which of the two candidate codeword is the correct one. To do this the process 900b implements one or more CRC checks. The CRC checks may be based on a set of one or more masks mask 235 (FIG. 2).

Certain masks may be used during CRC generation. The mask may be used to identify messages intended for different MSs, groups of MSs, or to identify a particular message type. The decoder may derive the candidate mask by generating a CRC from the received information bits and XOR the generated CRC with the received CRC. The candidate mask can then be compared with known masks to further determine if the code word under test is valid. In another example, the mask may be known to the decoder based on the message type derived from other information in the transmission.

The number of CRC checks is limited to a value lower than the maximum number of possible tail-biting codewords. The N tail-biting codewords for which the CRC check is performed are selected in an order which depends only on the position of the state associated with each codeword. This approach reduces implementation complexity as it avoids the need for a complex sorting operation. In order to randomize the states from which the tail-biting codewords are selected, it is possible to use a set of patterns which vary with the decoding being performed. The maximum number of tail-biting codewords for which CRC verification is performed can be adapted to the decoding configuration in order to trade off FDR against MDR.

In another example, a quality metric (QM) is computed for each of the candidate codewords and this quality metric is used to select the codeword to output. The quality metric can be calculated from the end path metrics of the different states. For example, $QM=(PM_{STATE}-PM_{MIN})/(PM_{MAX}-PM_{MIN})$. Candidate codewords may be required to have a quality metric that meets or exceeds a pre-defined threshold. Alternatively, the quality metric can be used to rank the candidate codewords and select one or more output codewords based on this ranking.

Referring to FIG. 6, bit forcing is used for the state machine during forward processing. At 600, bit information in the codeword is known a priori. For example, the PBCH or the PDCCH channels defined in 3GPP LTE may use data fields that are known to the decoder. The decoder can force trellis transitions that match the known bit fields, e.g., during forward processing. Alternatively, the process 900 can filter out on trace-back, those candidate codewords that do not have states that match states corresponding to the known bit field information.

It should be noted that the a priori information on the transmitted information bits may take the form of knowledge of invalid sequences rather than knowledge of specific values for bits in the transmitted message. For example, the message may be formed through the concatenation of multiple fields. It is then possible for the number of valid values of this field to be lower than the number of sequences that can be represented by the bit field (for example if the number of valid entries is lower than 2 raised to the power of the number of bits in the field). In such a case, the filtering out of invalid candidate code word can be performed by rejecting sequences that do not correspond to any of the set of possible transmitted sequences.

In a third alternative embodiment, the known bit field information may be used to limit the set of possible beginning and/or starting states. For example, if the number of known bits is larger than or equal to the memory length of the encoder, then the state of the trellis at the position corresponding to the known bit field information will be perfectly known a priori by the receiver. Hence, by starting the trellis processing at the position corresponding to this known bit field, it is possible to force the beginning state to be the one corresponding to this bit field (or part of this bit field if the number of known bits is strictly larger than the encoder memory) and the trace-back only needs to be performed for the ending state which also corresponds to the bit field (note that it is possible to start the trellis processing at any arbitrary position in the received bit sequence since the trellis associated with a tail-biting convolutional code is circular). If the number of known bits is strictly lower than the encoder memory, the starting/ending state will not be fully known but it is possible to reject tests corresponding to states which do not match the known bit field information.

Referring now to FIGS. 7a and 7b, another embodiment of the Viterbi forward processing and parallel trace-back process 900a that tracks the least reliable decisions will now be described. A least reliable decision is a decision where the path metrics are close enough (i.e., the path metric difference is small) that one state might be chosen as easily as the other, e.g., like a coin toss. When the probabilities are close, a state decision is more likely to be incorrect, i.e., less reliable. At 700, forward processing begins. At 710, a least reliable decision is identified and it location is stored as described above. In case of multiple Viterbi forward processing iterations, the generation of least reliable decision information can be limited to the last iteration.

On trace-back, the least reliable position associated with each state is used to generate alternate paths. Referring to FIG. 7b, at 720, the trace-back yielded an invalid path since the starting and ending state did not match. However, because the least reliable decision information was stored at 710, process 900 can overrule and reverse the initial decision made during forward processing. At 730, the state branching decision is reversed based on the decision bit stored in the path history and a path with matching starting and ending states has now been formed, thereby increasing the chances that a valid codeword may be obtained. Although, only a single decision reversal is shown for simplicity in FIG. 7b, it should be understood that the reversal of the least reliable decision may be performed for each of the S parallel trace-back operations, thereby leading to a number of parallel trace-backs equal to twice the number of states, i.e., 2S.

In order to reduce complexity and/or to reduce the FDR, the reversal of the least reliable decision can also be performed on a subset of the S states. For example, the reversal may be performed only for states with a least reliable decision metric below a given threshold. Alternatively, it would be possible to perform the least reliable decision reversal on the L states (L<S) having the lowest metrics.

When quality metrics are used in order to select output codewords, it is possible to generate quality metrics for the candidate output codewords generated through the least reliable decision reversal. If $QM=(PM_{STATE}-PM_{MIN})/(PM_{MAX}-PM_{MIN})$ denotes the quality metric associated with a given state, the quality metric value for the candidate codeword generated for the least reliable decision reversal can be calculated as $QM=(PM_{STATE}-PM_{MIN}-LRM_{STATE})$ $(PM_{MAX}-PM_{MIN})$. Alternatively, this metric can be calculated as max $\{(PM_{STATE}-PM_{MIN}-LRM_{STATE})/(PM_{MAX}-PM_{MIN}), 0\}$. These metrics can then be used as described above in order to select output codewords. Alternatively, it is possible to use the same QM for the 2 candidate codewords generated from the same state and always select codewords without least reliable decision reversal when comparing candidate codewords with identical quality metrics.

It should also be noted that the least reliable decision reversal approach can be extended such that candidate codewords are generated not just from the least reliable decision associated with a given end state but from the M least reliable decisions associated with this state. Increasing the number of candidate codewords which are generated during trace-back by reverting more than one unreliable decision per ending state will lead to an improved MDR performance. It may also lead to an increase in FDR but this degradation may be reduced by performing further checks on the candidate codewords using the techniques presented in this document.

The extension of the least reliable decision reversal approach will now be presented for the case of M=2. This corresponds to the generation of 3 candidate codewords for each state, one codewords corresponding to the most likely path and 2 alternative codewords corresponding to the reversal of the 2 least reliable decisions. From this example, further extensions to cases where M>2 will be clear to one skilled in the art.

For each state $S_s$, and for each transition k, the following 4 metrics are computed:

LRM0($S_s$, k): metric associated with the least reliable decision

LRM1($S_s$, k): metric associated with the second least reliable decision

LRP0($S_s$, k): position of the least reliable decision. This corresponds to a single value indicating the transition index of the least reliable decision in the trellis LRP1($S_s$, k): position or positions of second least reliable decision. In some cases, the second least reliable decision will correspond to a single divergence from the most likely path. In such cases, the metric LRP1($S_s$, k) will be made of a single transition index. Alternatively, the second least reliable decision will be made of 2 reversals of the decisions corresponding to the most likely path. In these cases, the metric LRP1($S_s$, k) will be made of the two transition indices at which the two decision reversals need to take place in order to generate the $3^{rd}$ most likely path.

The generation of the metrics LRM0($S_s$, k+1), LRM1($S_s$, k+1), LRP0($S_s$, k+1) and LRP1($S_s$, k+1) for state $S_s$ will now be described. The two states merging to state $S_s$ will be denoted as $S_{10}$ and $S_{11}$. It will be assumed, without any loss of generality, that state $S_{10}$ is the selected leading state in the path metric comparison used to calculate $PM(S_s, n+1)$. The least reliable decision metric $LRM0(S_s, k+1)$ and associated position $LRP0(S_s, k+1)$ are calculated as in the single reversal case as depicted in FIG. 3b. First a metric is calculated to quantify the reliability of the decision made in the selection of the latest path metric:

$$D = |(BM0-BM1) + (PM(S_{10},k) - PM(S_{11},k))|$$

This metric D is then compared to $LRM0(S_{10}, k)$. $LRM0(S_s, k+1)$ and $LRP0(S_s, k+1)$ are calculated as:

```
If (D < LRM0(S_{I0}, k)) {
    LRM0(S_s, k+1) = D
    LRP0(S_s, k+1) = k+1 }
Else {
    LRM0(S_s, k+1) = LRM0(S_{I0}, k)
    LRP0(S_s, k+1) = LRP0(S_s, k) }
```

The calculation of $LRM1(S_s, k+1)$ and $LRP1(S_s, k+1)$ then depends on which of the two above tests succeed. The calculation will first be described for case (1), i.e. when $D<LRM0(S_{10}, k+1)$. The metrics associated with the second least reliable decision are then calculated as follows:

```
If (LRM0(S_{I0}, k) < f(D, LRM0(S_{I1}, k))) {
    LRM1(S_s, k+1) = LRM0(S_{I0}, k)
    LRP1(S_s, k+1) = LRP0(S_{I1}, k) }
Else {
    LRM1(S_s, k+1) = f(D, LRM0(S_{I1}, k))
    LRP1(S_s, k+1) = {k+1, LRP0(S_{I1}, k) }
```

The function f(x, y) takes 2 reliability metrics x and y to generate a reliability metric for the combination of these 2 components. It will be recognized by the person skilled in the art that multiple solutions exist for the implementation of the function f(x, y). For example, the function f(x, y) could be simply implemented as:

$$f(x,y) = x+y$$

Alternatively, it would be possible to compute this function as:

$$f(x,y) = \log(\exp(x) + \exp(y))$$

The computation of the metrics $LRM1(S_s, k+1)$ and $LRP1(S_s, k+1)$ will now be described for the second case in the result of the test perform for the generation of the least reliable decision metrics. The metrics $LRM1(S_s, k+1)$ and $LRP1(S_s, k+1)$ are calculated as follows:

```
If (D < LRM1(S_{I0}, k)) {
    LRM1(S_s, k+1) = D
    LRP1(S_s, k+1) = k+1 }
Else {
    LRM1(S_s, k+1) = LRM1(S_{I0}, k)
    LRP1(S_s, k+1) = LRP1(S_{I0}, k) }
```

Figure 8:
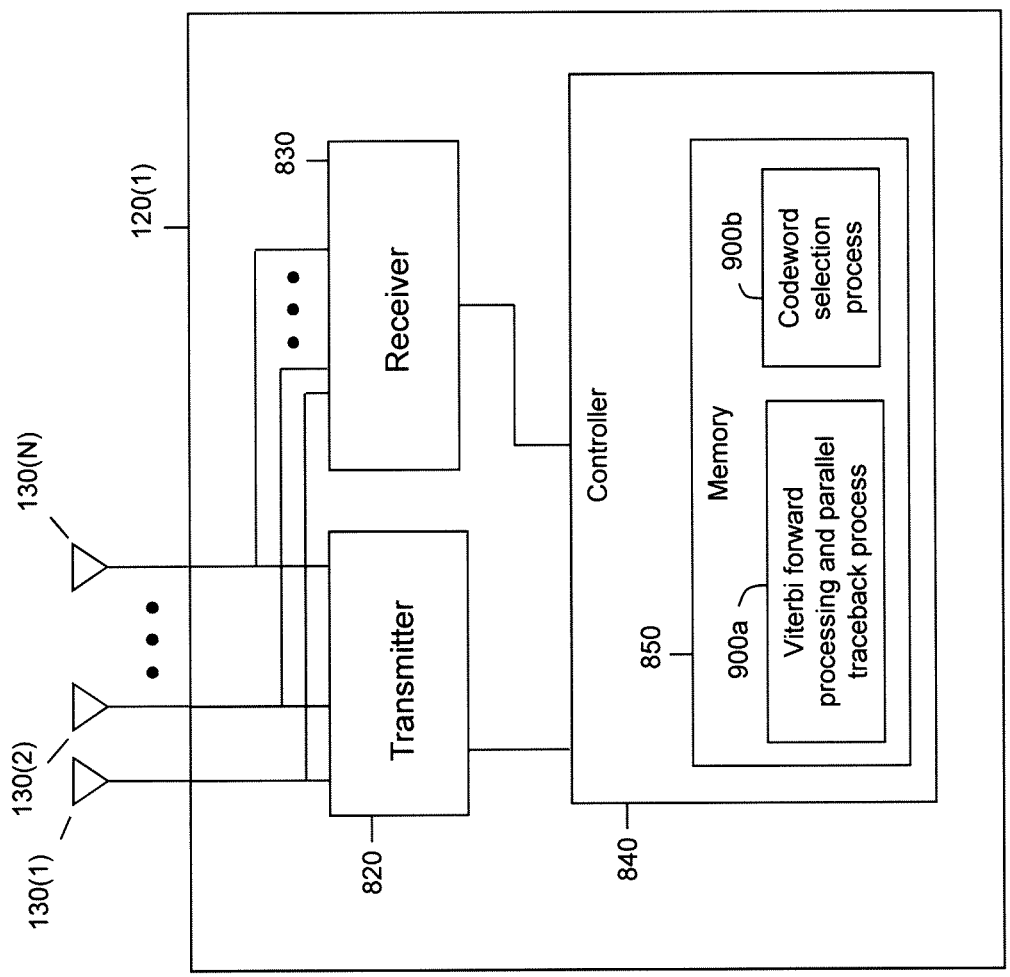
FIG. 8 is an example block diagram of a mobile station that implements a Viterbi and CRC decoding process according to the techniques described herein.

Turning to FIG. 8, an example of a block diagram is shown of a wireless communication device that may serve as a BS 110 or an MS 120 for purposes of describing the Viterbi and codeword selection techniques. FIG. 8 depicts MS 120(1) as an example of a wireless communication device that is configured to perform the Viterbi and CRC decoder techniques described herein, but again, it is to be understood that the BS 110 may also be configured to perform these techniques as well. The wireless communication device MS 120(1) comprises a transmitter 820, a receiver 830, and a controller 840. The controller 840 supplies the data to the transmitter 820 to be transmitted and processes signals received by the receiver 830. In addition, the controller 840 performs other transmit and receive control functionality. Part of the functions of the transmitter 820 and receiver 830 may be implemented in a modem and other parts of the transmitter 820 and receiver 830 may be implemented in radio transmitter and radio transceiver circuits. It should be understood that there are analog-to-digital converters (ADCs) and digital-to-analog converters (DACs) in the various signal paths to convert between analog and digital signals.

The transmitter 820 may comprise individual transmitter circuits that supply respective upconverted signals to corresponding ones of a plurality of antennas 130(1)-130(N) for transmission. The receiver 830 comprises a detector 860 for detecting the signals received at each of the antennas 130(1)-130(N) and supplies corresponding detected data, e.g., LLR data, to the controller 840. It is understood that the receiver 830 may comprise a plurality of receiver circuits, each for a corresponding one of a plurality of antennas 130(1)-130(N). For simplicity, these individual receiver circuits are not shown. The controller 840 comprises a memory 850 or other data storage block that stores data used for the techniques described herein. The memory 850 may be separate or part of the controller 840. Instructions for performing the Viterbi forward processing and parallel trace-back process 900a and codeword selection process 900b may be stored in the memory 850 for execution by the controller 840.

The functions of the controller 840 may be implemented by logic encoded in one or more tangible (non-transitory) media (e.g., embedded logic such as an application specific integrated circuit, digital signal processor instructions, software that is executed by a processor, etc.), wherein the memory 850 stores data used for the computations described herein (and/or to store software or processor instructions that are executed to carry out the computations described herein). Thus, the processes 900a and 900b may be implemented with fixed logic or programmable logic (e.g., software/computer instructions executed by a processor).

Referring to FIG. 9a, the Viterbi forward processing and parallel trace-back process 900a will now be described. At 910, data are received comprising a message encoded with a tail-biting convolutional code. The message may also be CRC encoded and the CRC encoding may entail using one of a plurality of known CRC masks. At 920, the data are detected for a given data length that represents a code block. At 930, one or more forward processing iterations are performed on the code block for generating information representing a state diagram for potential state transitions used by an encoder in encoding the message and for identifying paths from ending states to beginning states in the state diagram. At 940, a single parallel trace-back operation is performed from multiple ending states along corresponding identified paths to determine when at least one ending state matches a beginning state within the state diagram for a given path. At 950, one or more candidate codewords are generated when the trace-back operation leads to a beginning state that matches a corresponding ending state.

Turning to FIG. 9b, codeword selection process 900b will now be described. At 960, one or more valid codewords are identified from among the one or more candidate codewords. At 970, one or more valid codewords may be further identified from among the one or more first candidate codewords when a candidate codeword passes a CRC check condition or meets quality metric criteria, as described herein. The CRC check condition may use one of the plurality of known CRC masks, as describe above. The codeword selection process 900b may also use quality metrics and bit forcing techniques to reduce the codeword candidate set. At 980, the message is generated from the one or more valid codewords.

The different techniques presented in this document can be combined together in order to achieve the desired trade-off in MDR/FDR performance. Some of these techniques, such as parallel trace-back from multiple end states, bit forcing to match forward processing decisions to known bits and generation of candidate codewords based on the least reliable decisions will improve the MDR performance at the expense of an increase in FDR. On the other hand, the use of quality metrics to reject candidate codewords as well as the use of the knowledge of invalid field values will reduce the FDR at the expense of a poorer MDR performance.

The receiver can therefore adapt the processing of the received signal to achieve the desired FDR/MDR trade-off and adapt to transmission and propagation conditions. For example, when multiple CRC masks are used by the receiver to perform the CRC check, the FDR will increase with the number of masks in the set being tested. Hence, when the number of CRC masks being tested is large, it will be beneficial to configure the receiver processing such that techniques which lower the FDR are used. Alternatively, it is possible that for some channels, the cost of missing a valid reception is higher than that of decoding an invalid message. In such a case, it will be beneficial to use techniques reducing MDR even if this leads to an increase in the FDR.

Although the apparatus, system, and method are illustrated and described herein as embodied in one or more specific examples, it is nevertheless not intended to be limited to the details shown, since various modifications and structural changes may be made therein without departing from the scope of the apparatus, system, and method and within the scope and range of equivalents of the claims. Accordingly, it is appropriate that the appended claims be construed broadly and in a manner consistent with the scope of the apparatus, system, and method, as set forth in the following claims.

What is claimed is:

1. A decoding method, for decoding data received at a communication device, the data comprising a message encoded with a tail-biting convolutional code, the decoding method comprising:

detecting the data for a given data length that represents a code block;

performing one or more forward processing iterations on the code block for generating information representing a state diagram for potential state transitions used by an encoder in encoding the message, for identifying paths from ending states to beginning states in the state diagram, and for tracking one or more positions in the state diagram of one or more least reliable state transition decisions;

performing a single parallel trace-back operation on the state diagram from multiple ending states along corresponding identified paths to determine when at least one ending state matches a beginning state within the state diagram for a given path;

generating one or more first candidate codewords when the trace-back operation leads to a beginning state that matches a corresponding ending state;

generating one or more second candidate codewords during the trace-back operation by reversing one or more of the one or more least reliable state transition decisions in the state diagram when the one or more first candidate codewords cannot be generated because the trace-back operation does not lead to a beginning state that matches a corresponding ending state;

identifying one or more valid codewords from among the one or more first and second candidate codewords; and generating the message from the one or more valid codewords.

2. The decoding method of claim 1, wherein the message is further encoded using a cyclic redundancy check (CRC), and wherein identifying comprises identifying the one or more valid codewords when a candidate codeword passes a CRC check condition.

3. The decoding method of claim 2, wherein identifying comprises identifying the one or more valid codewords when a candidate codeword passes the CRC check condition when the CRC encoding uses one of a plurality of known CRC masks.

4. The decoding method of claim 1, further comprising:

computing a quality metric (QM) for each of the one or more first candidate codewords; and wherein identifying comprises selecting one or more valid codewords based on the quality metrics.

5. The decoding method of claim 4, wherein computing the QM for a candidate codeword comprises:

$$QM=(PM_{STATE}-PM_{MIN})/(PM_{MAX}-PM_{MIN}).$$

6. The decoding method of claim 1, further comprising:

computing a quality metric (QM) for each of the one or more second candidate codewords; and wherein identifying comprises selecting one or more valid codewords from the one or more second candidate codewords based on the quality metrics.

7. The decoding method of claim 1, wherein the data comprises known bit information and the forward processing iteration further comprises forcing symbol state transitions in the state diagram to match the known bit information.

8. The decoding method of claim 1, wherein the data comprises known bit information and the method further comprises rejecting individual ones of the one or more first candidate codewords during the trace-back operation when states in the one or more first candidate codewords do not match states corresponding to the known bit information.

9. An apparatus comprising:

a receiver configured to receive data comprising a message encoded with a tail-biting convolutional code; and a controller coupled to the receiver and configured to:

detect the data for a given data length that represents a code block;

perform one or more forward processing iterations on the code block for generating information representing a state diagram for potential state transitions used by an encoder in encoding the message, for identifying paths from ending states to beginning states in the state diagram, and for tracking one or more positions in the state diagram of one or more least reliable state transition decisions;

perform a single parallel trace-back operation on the state diagram from multiple ending states along corresponding identified paths to determine when at least one ending state matches a beginning state within the state diagram for a given path;

generate one or more first candidate codewords when the trace-back operation leads to a beginning state that matches a corresponding ending state;

generate one or more second candidate codewords during the trace-back operation by reversing one or more of the one or more least reliable state transition decisions in the state diagram when the one or more first candidate codewords cannot be generated because the trace-back operation does not lead to a beginning state that matches a corresponding ending state;

identify one or more valid codewords from among the one or more first and second candidate codewords; and generate the message from the one or more valid codewords.

10. The apparatus of claim 9, wherein the message is further encoded using a cyclic redundancy check (CRC), and the processor is configured to identify the one or more valid codewords when a candidate codeword passes a CRC check condition.

11. The apparatus of claim 9, wherein the processor is further configured to:

compute a quality metric (QM) for each of the one or more first candidate codewords; and select one or more valid codewords based on the quality metrics.

12. The apparatus of claim 11, wherein the processor is configured to compute the QM for a candidate codeword using the equation:

$$QM=(PM_{STATE}-PM_{MIN})/(PM_{MAX}-PM_{MIN}).$$

13. The apparatus of claim 9, wherein the processor is further configured to:

compute a quality metric (QM) for each of the one or more second candidate codewords; and select one or more valid codewords from the one or more second candidate codewords based on the quality metrics.

14. The apparatus of claim 9, wherein the data comprises known bit information, the processor is further configured to force symbol state transitions in the state diagram to match the known bit information.

15. The apparatus of claim 9, wherein the data comprises known bit information, the processor is further configured to reject individual ones of the one or more first candidate codewords during the trace-back operation when states in the one or more first candidate codewords do not match states corresponding to the known bit information.

16. A non-transitory processor readable storage media, storing instructions that, when executed by a processor, cause the processor to:

receive data comprising a message encoded with a tail-biting convolutional code;

detect the data for a given data length that represents a code block;

perform one or more forward processing iterations on the code block for generating information representing a state diagram for potential state transitions used by an encoder in encoding the message, for identifying paths from ending states to beginning states in the state diagram, and for tracking one or more positions in the state diagram of one or more least reliable state transition decisions;

perform a single parallel trace-back operation on the state diagram from multiple ending states along corresponding identified paths to determine when at least one ending state matches a beginning state within the state diagram for a given path;

generate one or more first candidate codewords when the trace-back operation leads to a beginning state that matches a corresponding ending state;

generate one or more second candidate codewords during the trace-back operation by reversing one or more of the one or more least reliable state transition decisions in the state diagram when the one or more first candidate codewords cannot be generated because the trace-back operation does not lead to a beginning state that matches a corresponding ending state;

identify one or more valid codewords from among the one or more first and second candidate codewords; and generate the message from the one or more valid codewords.

17. The non-transitory processor readable storage media of claim 16, wherein the message is further encoded using a cyclic redundancy check (CRC), and wherein the instructions operable to identify comprise instructions to identify the one or more valid codewords when a candidate codeword passes a CRC check condition.

18. The non-transitory processor readable storage media of claim 16, further comprising instruction that, when executed by the processor, cause the processor to:

compute a quality metric (QM) for each of the one or more first candidate codewords; and select one or more valid codewords based on the quality metrics.

19. The non-transitory processor readable storage media of claim 16, wherein the data comprises known bit information, and the instructions that forward process further comprise instructions configured to force symbol state transitions in the state diagram to match the known bit information.

20. The processor readable storage media of claim 16, wherein the data comprises known bit information, and further comprising instructions that, when executed by the processor, cause the processor to reject individual ones of the one or more first candidate codewords during the trace-back operation when states in the one or more first candidate codewords do not match states corresponding to the known bit information.

* * * * *